United States Patent
Chen et al.

(10) Patent No.: US 11,930,618 B2
(45) Date of Patent: Mar. 12, 2024

(54) LIQUID COOLING HEAD AND LIQUID COOLING DEVICE WITH THE SAME

(71) Applicant: Auras Technology Co., Ltd., New Taipei (TW)

(72) Inventors: Chien-Yu Chen, New Taipei (TW); Tian-Li Ye, New Taipei (TW); Jen-Hao Lin, New Taipei (TW); Chien-An Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 255 days.

(21) Appl. No.: 17/462,371

(22) Filed: Aug. 31, 2021

(65) Prior Publication Data
US 2022/0071058 A1     Mar. 3, 2022

Related U.S. Application Data

(60) Provisional application No. 63/073,593, filed on Sep. 2, 2020.

(51) Int. Cl.
| | |
|---|---|
| *H05K 7/20* | (2006.01) |
| *B23K 31/02* | (2006.01) |
| *F28D 15/02* | (2006.01) |
| *F28D 15/04* | (2006.01) |
| *F28D 21/00* | (2006.01) |

(Continued)

(52) U.S. Cl.
CPC ......... *H05K 7/20272* (2013.01); *B23K 31/02* (2013.01); *F28D 15/0233* (2013.01); *F28D 15/046* (2013.01); *F28F 9/18* (2013.01); *H05K 7/20263* (2013.01); *H05K 7/20336* (2013.01); *H05K 7/2039* (2013.01); *B23K 2101/14* (2018.08); *F28F 2230/00* (2013.01);

(Continued)

(58) Field of Classification Search
CPC .......... H05K 7/20281; H05K 7/20272; H05K 7/20263; H05K 7/20254; H05K 7/20218; H01L 23/473; F28D 2021/0028; F28D 2021/0029

See application file for complete search history.

(56) References Cited

U.S. PATENT DOCUMENTS

| | | | | |
|---|---|---|---|---|
| 8,051,898 B2 * | 11/2011 | Chiang | ................. | H01L 23/473 417/313 |
| 9,345,169 B1 * | 5/2016 | Campbell | .......... | H05K 7/20327 |

(Continued)

*Primary Examiner* — Frantz F Jules
*Assistant Examiner* — Jason N Thompson
(74) *Attorney, Agent, or Firm* — MUNCY, GEISSLER, OLDS & LOWE, P.C.

(57) ABSTRACT

A liquid cooling head includes a bottom plate, a heat dissipation plate, a partition plate and an upper cover plate. The bottom plate includes an opening, and the heat dissipation plate, the partition plate and the upper cover plate are fixed to the bottom plate. The partition plate divides the opening into a plurality of cooling chambers, and each cooling chamber is equipped with a cooling liquid inlet, a cooling liquid outlet, a pump and an electric control device. The cooling liquid inlet and the cooling liquid outlet are formed in the upper cover plate, the pump is fluid-connected to the cooling liquid outlet, and the electric control device drives the pump to rotate, so that the cooling liquid flows through the cooling chamber to cool one heat source below the heat dissipation plate. In addition, a liquid cooling device with the liquid cooling head is also disclosed therein.

13 Claims, 6 Drawing Sheets

(51) Int. Cl.
    *F28F 9/18* (2006.01)
    *H01L 23/473* (2006.01)
    *B23K 101/14* (2006.01)
    *G06F 1/20* (2006.01)

(52) U.S. Cl.
    CPC ..... *F28F 2245/00* (2013.01); *F28F 2275/062* (2013.01); *G06F 1/20* (2013.01)

(56) References Cited

U.S. PATENT DOCUMENTS

| | | | |
|---|---|---|---|
| 10,048,008 B1* | 8/2018 | Mounioloux | F28D 1/05366 |
| 2006/0171801 A1* | 8/2006 | Manabe | H01L 23/473 |
| | | | 415/176 |
| 2006/0264073 A1* | 11/2006 | Yang | H01L 23/473 |
| | | | 257/E23.098 |
| 2008/0105407 A1* | 5/2008 | Yeh | H01L 23/467 |
| | | | 257/E23.098 |
| 2009/0236083 A1* | 9/2009 | Brand | F28F 3/048 |
| | | | 165/181 |
| 2011/0094722 A1* | 4/2011 | Mori | H01L 23/473 |
| | | | 165/181 |
| 2016/0338223 A1* | 11/2016 | Tsai | F28F 3/12 |
| 2017/0235350 A1* | 8/2017 | Tsai | G06F 1/20 |
| | | | 165/80.4 |
| 2019/0239388 A1* | 8/2019 | Tsai | H05K 7/20254 |
| 2019/0242661 A1* | 8/2019 | Huang | F28F 1/32 |
| 2019/0364694 A1* | 11/2019 | Lin | H01L 23/473 |

\* cited by examiner

LIQUID COOLING HEAD AND LIQUID COOLING DEVICE WITH THE SAME

RELATED APPLICATIONS

This application claims priority to U.S. Provisional Application Ser. No. 63/073,593, filed Sep. 2, 2020, the disclosures of which are incorporated herein by reference in their entireties.

TECHNICAL FIELD

The present disclosure generally relates to a liquid cooling head. More particularly, the present disclosure relates to a liquid cooling device with a liquid cooling head.

BACKGROUND

With the advancement of technology, electronic products have become more popular, and gradually changed the life or work of many people. As the calculating power of the computers increases, the temperature control of the electronic components such as the central processing units is more important.

Electronic components such as the central processing units generate heat during operation and require proper cooling to achieve the best performance. In order to keep the central processing unit and other electronic components operating at a proper temperature, a liquid cooling device or an air cooling device is usually used.

In the current water-cooling heat dissipation device, the working fluid flows into the water cooling head through the pipeline, and the water cooling head contacts the surface of the metal cover of the electronic component, e.g. the central processing unit, to take away the heat generated by the electronic component during operation, thereby reducing the operating temperature of the electronic component, and improving the working efficiency of the electronic component.

Therefore, there is a need to improve the performance and efficiency of the water cooling head so as to improve the performance and efficiency of the electronic products.

SUMMARY

One objective of the embodiments of the present invention is to provide a liquid cooling head and a liquid cooling device with the same to effectively improve the heat dissipation efficiency of the liquid cooling head and the liquid cooling device, and effectively reduce production costs thereof through a modular production.

To achieve these and other advantages and in accordance with the objective of the embodiments of the present invention, as the embodiment broadly describes herein, the embodiments of the present invention provides a liquid cooling head including a bottom plate, a heat dissipation plate, a partition plate and an upper cover plate. The bottom plate has an opening, the heat dissipation plate, the partition plate and the upper cover plate are fixed to the bottom plate. The partition plate divides the opening into a plurality of cooling chambers, and each of the cooling chambers is equipped with a cooling liquid inlet, a cooling liquid outlet, a pump and an electric control device. The cooling liquid inlet and the cooling liquid outlet are formed in the upper cover plate, the pump is arranged between the partition plate and the upper cover plate and is fluid-connected to the cooling liquid outlet, and the electric control device rotates the pump to force a cooling liquid to flow through the cooling chambers so as to cool at least one heat source below the heat dissipation plate.

In some embodiments, the liquid cooling head further includes an outer cover plate to fix the electric control device around the pump so as to rotate the pump.

In some embodiments, the partition plate includes a horizontal baffle and a vertical baffle, the vertical baffle is connected to the horizontal baffle, and the vertical baffle divides the opening into the cooling chambers respectively located on both sides of the vertical baffle.

In some embodiments, each of the cooling chambers includes a liquid entrance hole and a liquid exit hole on the partition plate, and the pump is located above the liquid exit hole.

In some embodiments, a plurality of guiding blades are formed under the liquid entrance hole to guide the cooling liquid.

In some embodiments, an included angle is formed between the guiding blades and the vertical baffle to guide the cooling liquid flowing toward the vertical baffle. In some embodiments, the included angle is about 30 degrees to 60 degrees.

In some embodiments, an interval between two adjacent guiding blades close to the vertical baffle is gradually larger than an interval between two adjacent guiding blades far away from the vertical baffle. In some embodiments, a guiding blade length of a guiding blade close to the vertical baffle is gradually larger than a guiding blade length of a guiding blade far away from the vertical baffle.

In some embodiments, each of the cooling chambers includes skived fins therein.

According to another aspect of the present invention, a liquid cooling device is provided. The liquid cooling device includes a foregoing liquid cooling head and a first cooling tower. The first cooling tower includes a first liquid entrance opening and a first liquid exit opening. The first liquid entrance opening is connected to the cooling liquid outlet of the second cooling chamber, and the first liquid exit opening is connected to the cooling liquid inlet of the first cooling chamber to allow the cooling liquid from the second cooling chamber entering into the first cooling tower to dissipate heat and then entering into the first cooling chamber.

In some embodiments, the liquid cooling device further includes a second cooling tower, and the second cooling tower includes a second liquid entrance opening and a second exit opening, the second liquid entrance opening is connected to the cooling liquid outlet of the first cooling chamber, the second exit opening is connected to the cooling liquid inlet of the second cooling chamber to allow the cooling liquid from the first cooling chamber entering into the second cooling tower to dissipate heat and then entering into the second cooling chamber.

In some embodiments, the liquid cooling device further includes a fan disposed between the first cooling tower and the second cooling tower.

In some embodiments, the first cooling tower and the second cooling tower respectively include a lower water tank, an upper water tank, a plurality of flat liquid pipes, and a plurality of heat dissipation fins. The flat liquid pipes are connected between the lower water tank and the upper water tank. The heat dissipation fins surround the flat liquid pipes and are located between the lower water tank and the upper water tank.

In some embodiments, the liquid cooling device further includes an upper water tank cover and a lower water tank cover. The upper water tank cover is located between the upper water tank and the heat dissipation fins, and the lower water tank cover is located between the lower water tank and the heat dissipation fins. The upper water tank cover and the lower water tank cover respectively include a plurality of elastic clamping devices, the upper water tank and the lower water tank respectively include a fixing flange, and the elastic clamping devices are respectively bent and pressed on a corresponding fixing flange.

In some embodiments, the first cooling tower and the second cooling tower have a same size and symmetrically located on two sides of the liquid cooling head.

In some embodiments, the liquid cooling device further includes a return pipe connected between the cooling liquid outlet of the first cooling chamber and the cooling liquid inlet of the second cooling chamber.

Hence, the aforementioned liquid cooling head and the liquid cooling device with the same can utilize a single cooling tower or a plurality of cooling towers to dissipate heat according to actual needs, and adjust the required heat dissipation efficiency and performance according to heat quantity generated by a heat source, and the components of the liquid cooling head and/or the liquid cooling device are symmetrical and shared so as to further reduce production costs and improve product quality thereof.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
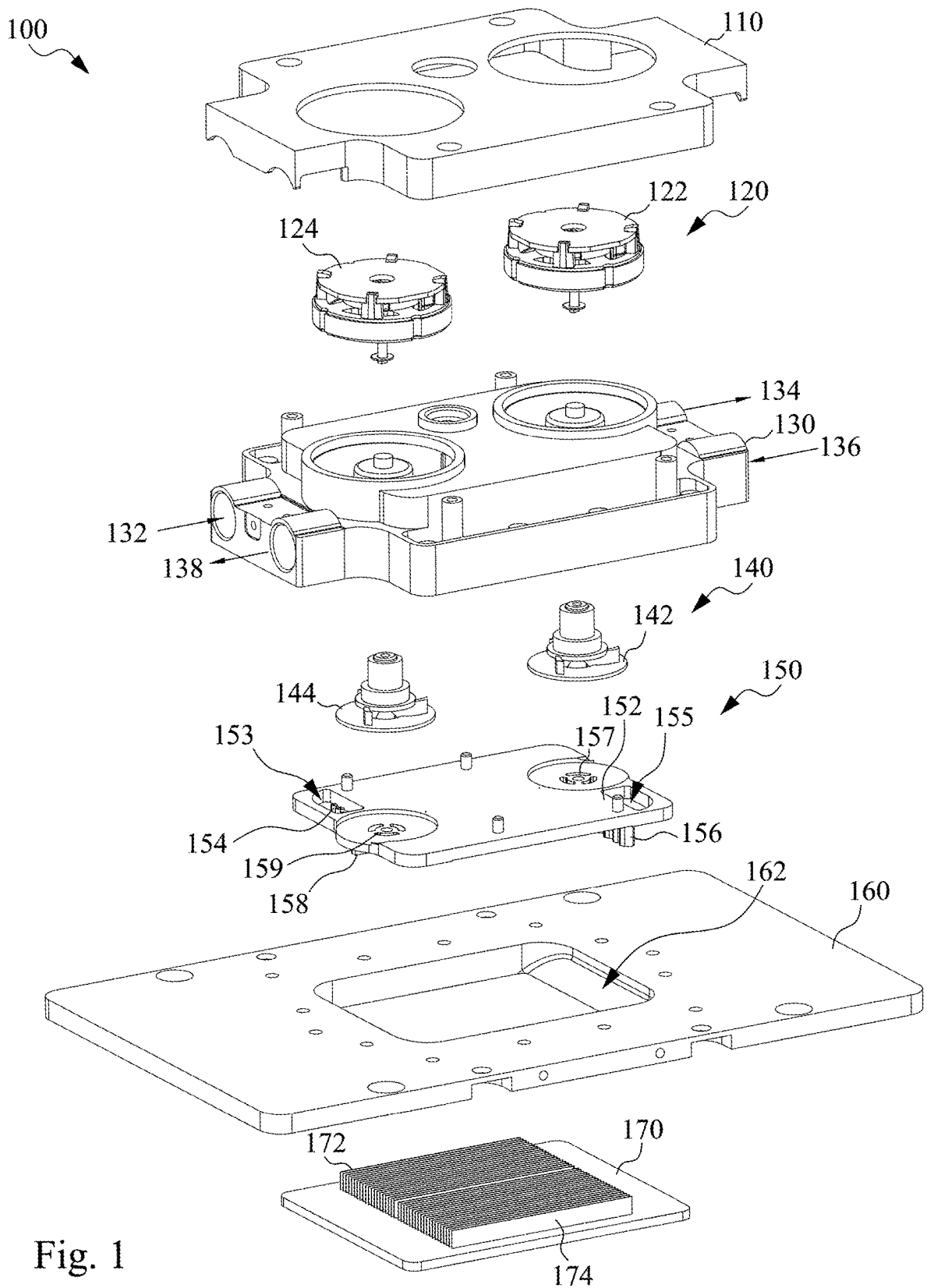
FIG. 1 illustrates a schematic exploded view showing a liquid cooling head according to one embodiment of the present invention.
Figure 2:
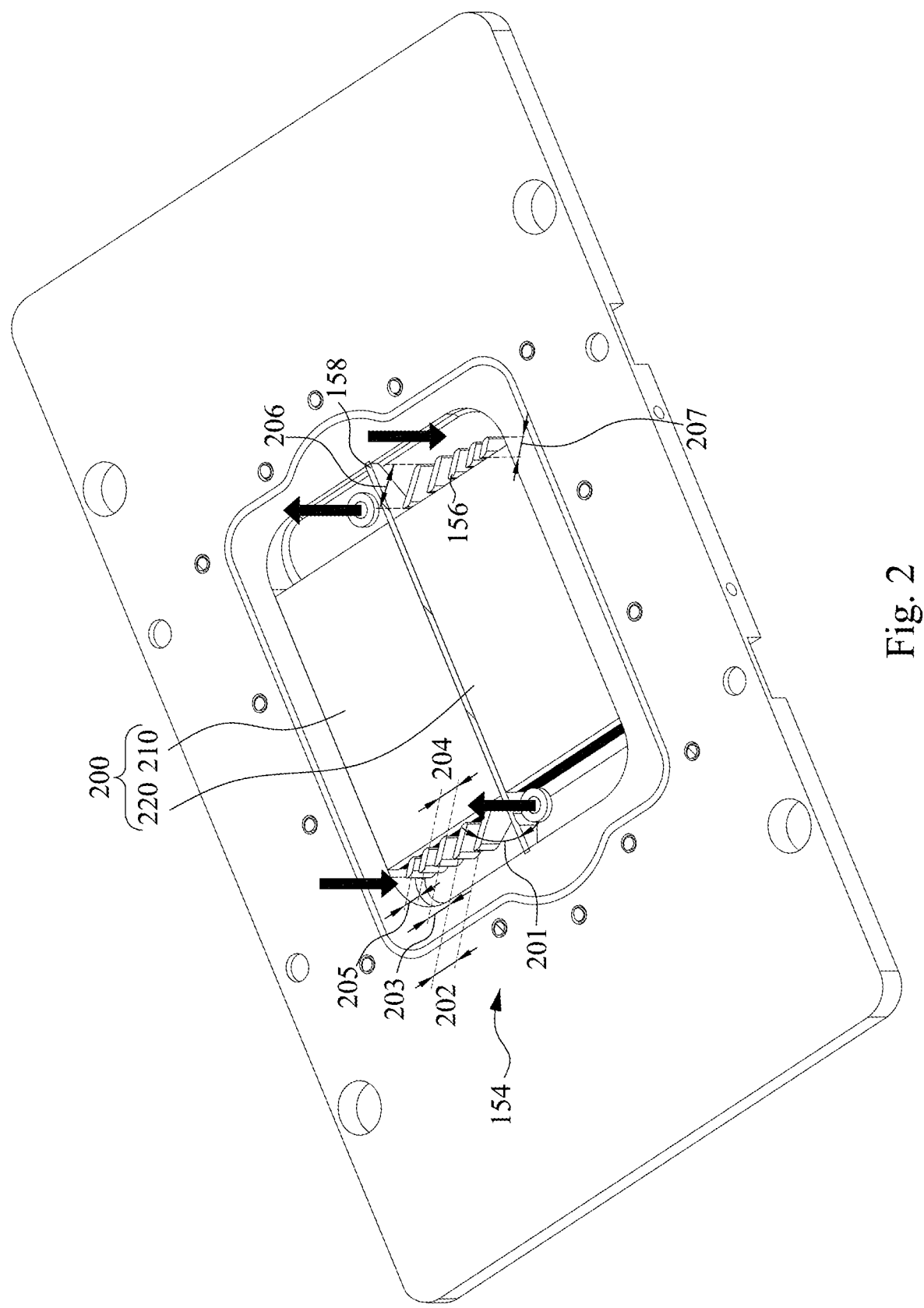
FIG. 2 illustrates a schematic partial view showing components in an opening of a bottom plate of the liquid cooling head of FIG. 1.
Figure 3:
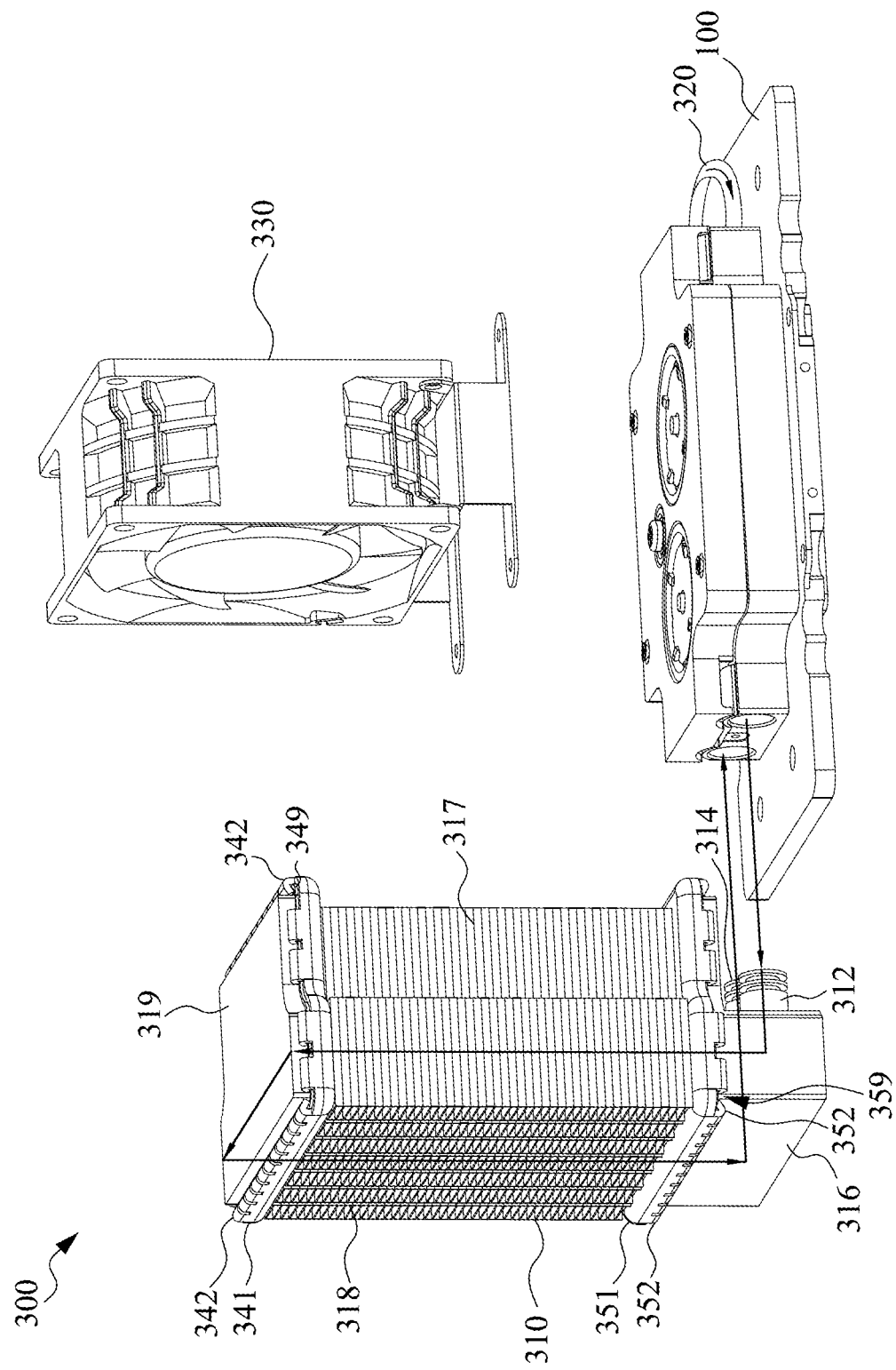
FIG. 3 illustrates a schematic exploded view showing a liquid cooling device according to an embodiment of another aspect of the present invention.
Figure 4:
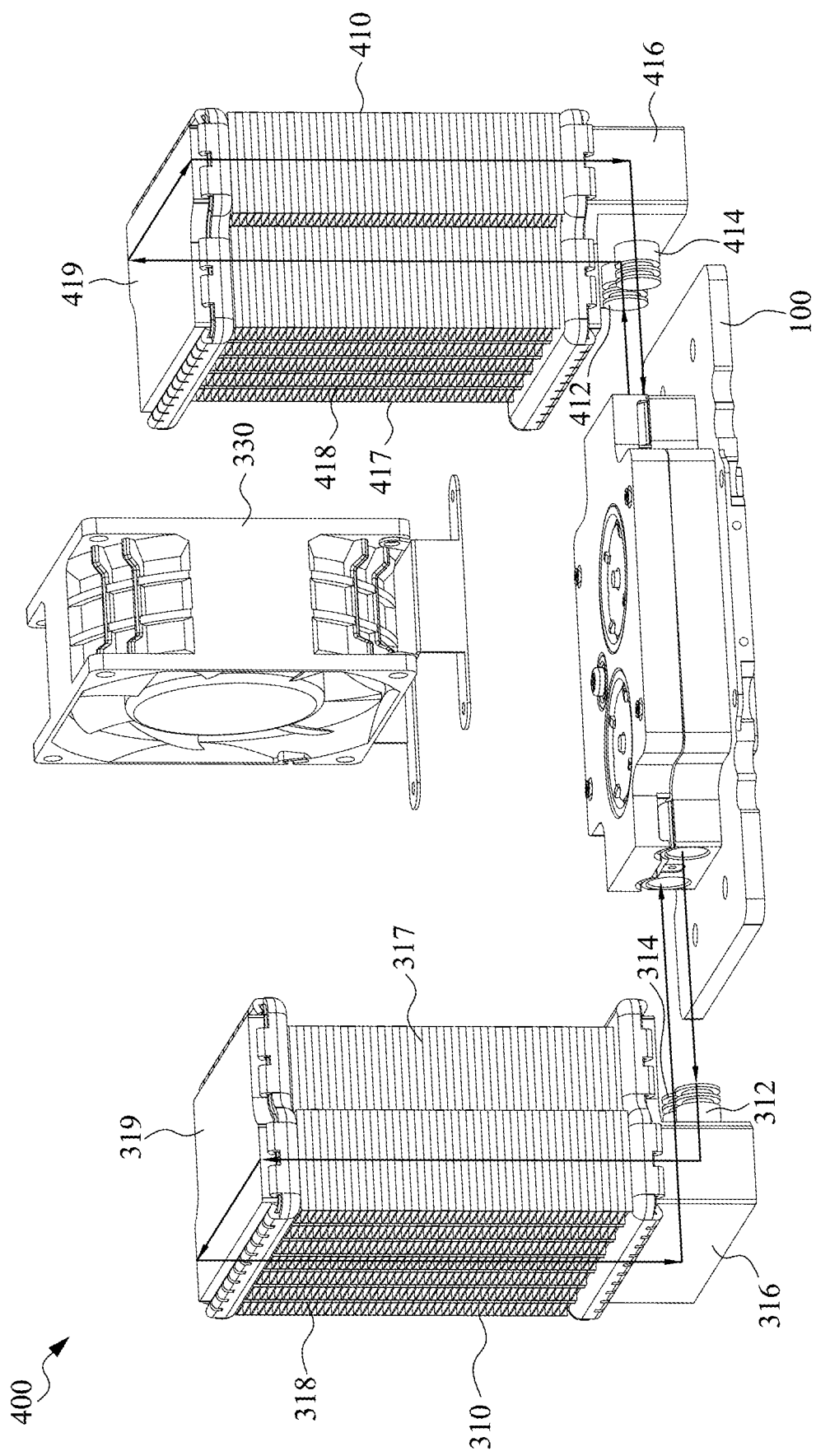
FIG. 4 illustrates a schematic exploded view showing a liquid cooling device according to another embodiment of another aspect of the present invention.
Figure 5A:
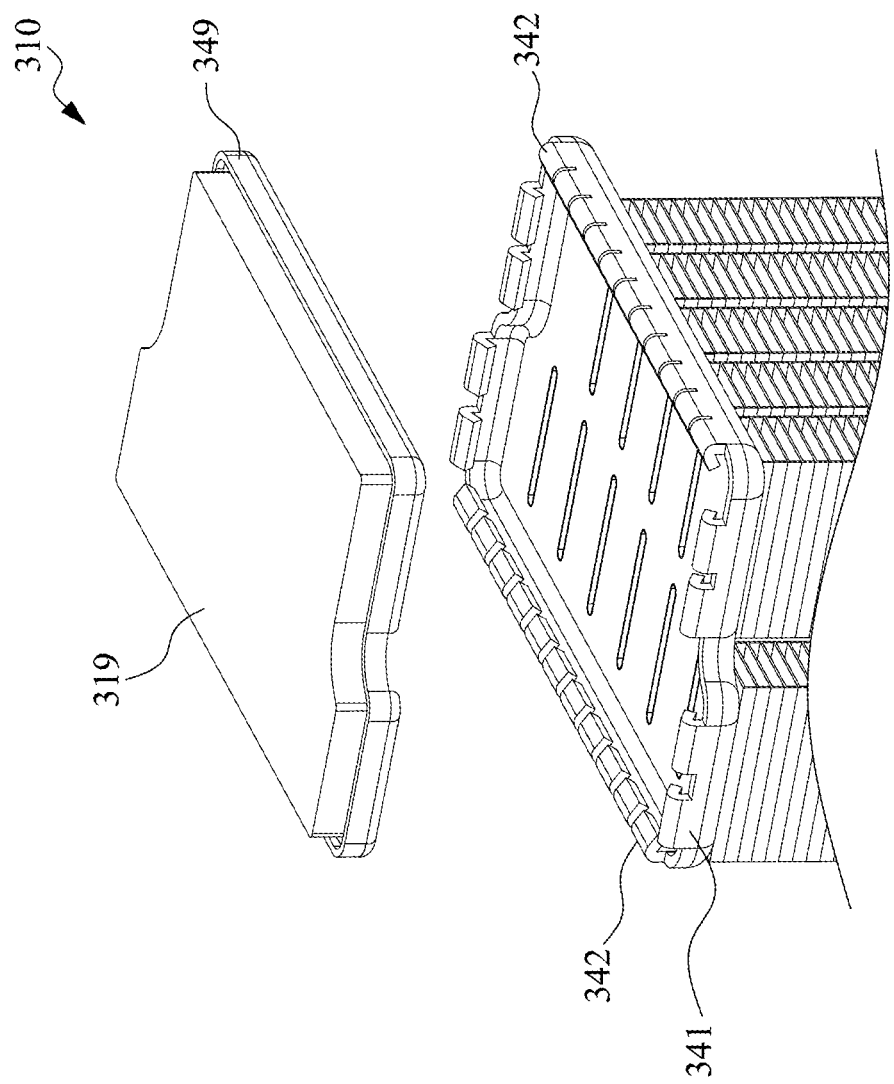
FIG. 5A illustrates a schematic partial exploded view of a cooling tower of a liquid cooling device.
Figure 5B:
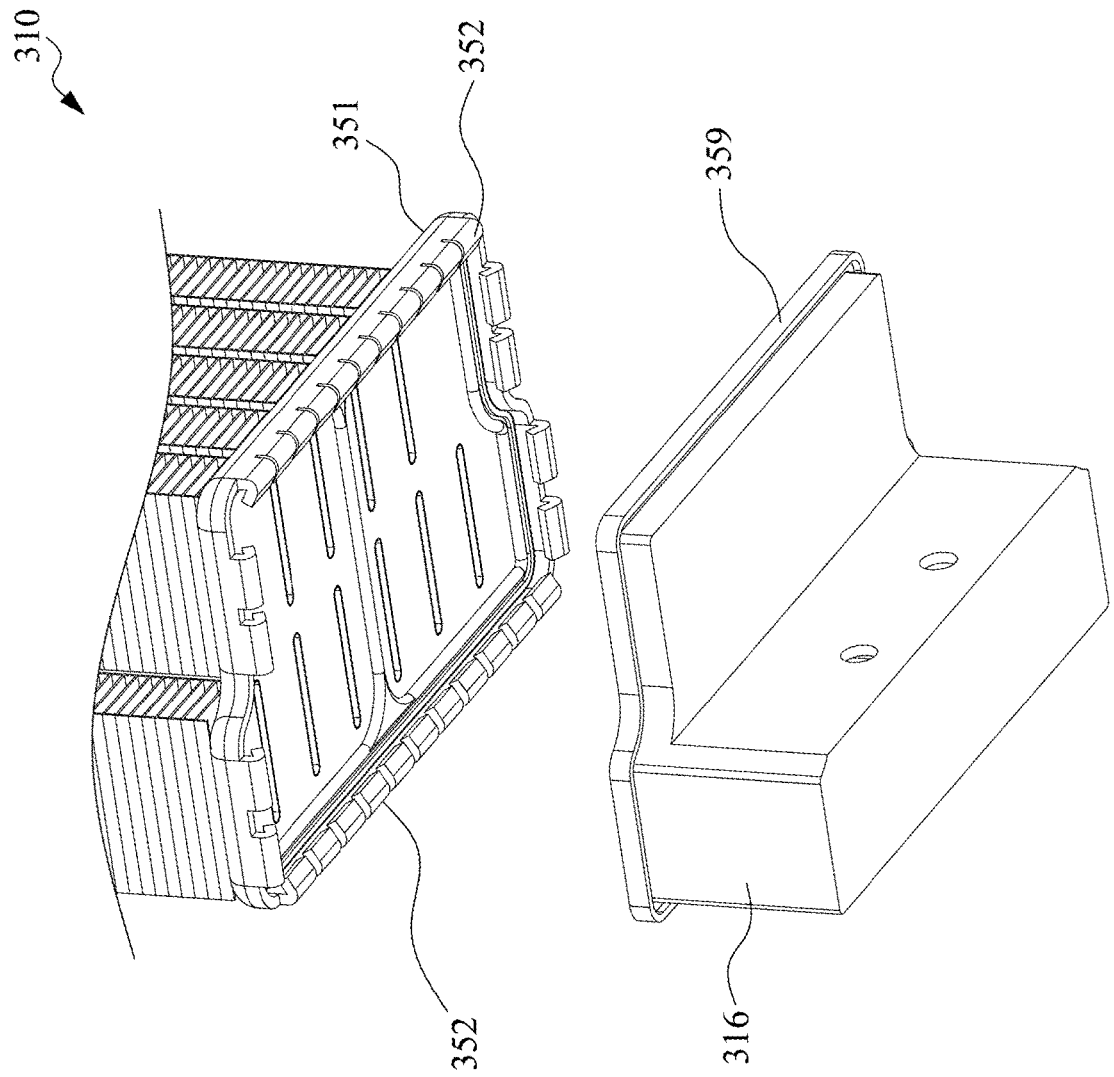
FIG. 5B illustrates another schematic partial exploded view of a cooling tower of a liquid cooling device.

FIG. 1 illustrates a schematic exploded view of a liquid cooling head according to one embodiment of the present invention, FIG. 2 illustrates a schematic partial view of components in an opening of a bottom plate of the liquid cooling head, FIG. 3 illustrates a liquid cooling device and FIG. 4 illustrates another liquid cooling device. FIG. 5A and FIG. 5B illustrate partial exploded views the cooling tower of the liquid cooling device.

Refer to FIG. 1 and FIG. 2. In order to clearly show the components in the opening of the bottom plate of the liquid cooling head, the horizontal baffle of the partition plate is omitted in FIG. 2 to conveniently describe the components in the opening of the bottom plate.

As shown in the figures, the liquid cooling head 100 includes a bottom plate 160, a heat dissipation plate 170, a partition plate 150, an upper cover plate 130 and an outer cover plate 110. The bottom plate 160 includes an opening 162, the heat dissipation plate 170 is fixed to the bottom plate 160, the partition plate 150 is fixed on the bottom plate 160 to divide the opening 162 into a plurality of cooling chambers 200, e.g. a first cooling chamber 210 and a second cooling chamber 220. The upper cover plate 130 is also fixed on the bottom plate 160. Each of the cooling chambers 200 is equipped with a cooling liquid inlet, a cooling liquid outlet, a pump 140 and an electric control device 120, for example, the first cooling chamber 210 is equipped with a first cooling liquid inlet 132, a first cooling liquid outlet 134, a first pump 142 and a first electric control motor 122, and the second cooling chamber 220 is equipped with a second cooling liquid inlet 136, a second cooling liquid outlet 138, a second pump 144 and a second electric control motor 124.

Firstly, the first cooling chamber 210 is taken as an example to further illustrate the structure of the liquid cooling head 100. The first cooling liquid inlet 132 and the first cooling liquid outlet 134 are formed in the upper cover plate 130, and the first pump 142 is arranged between the partition plate 150 and the upper cover plate 130 and is connected to the first cooling liquid outlet 134, for example, the first pump 142 is fluid-connected to the first cooling liquid outlet 134. A first electric control motor 122 of the electric control device 120 is utilized to rotate the first pump 142 to force a cooling liquid to flow through the first cooling chamber 210 to cool a heat source under the heat dissipation plate 170, e.g. an electronic device such as a central processing unit or an electronic device.

Similarly, the second cooling liquid inlet 136 and the second cooling liquid outlet 138 of the second cooling chamber 220 are formed in the upper cover plate 130, and the second pump 144 is arranged between the partition plate 150 and the upper cover plate 130 and is connected to the second cooling liquid outlet 138, for example, the second pump 144 is fluid-connected to the second cooling liquid outlet 138. A second electric control motor 124 of the electric control device 120 is utilized to rotate the second pump 144 to force the cooling liquid to flow through the second cooling chamber 220 to cool a heat source under the heat dissipation plate 170, e.g. an electronic device such as a central processing unit or an electronic device.

The outer cover plate 110 can effectively fix the first electric control motor 122 and the second electric control motor 124 of the electric control device 120 around the first pump 142 and the second pump 144 to rotate the first pump 142 and the second pump 144. The first pump 142 and the second pump 144 are arranged between the upper cover plate 130 and the partition plate 150 to forcibly flow the cooling liquid, and the first electric control motor 122 and the second electric control motor 124 are disposed at exterior of the upper cover plate 130, and sealed on the upper cover plate 130 with the outer cover plate 110 so that the first electric control motor 122 and the second electric control motor 124 are isolated with the cooling liquid to prevent from contacting with the cooling liquid, thereby further improving the service life and safety of the first electric control motor 122 and the second electric control motor 124.

In some embodiments, the partition plate 150 includes a horizontal baffle 152 and a vertical baffle 158, the vertical baffle 158 is connected to the bottom of the horizontal baffle 152, the vertical baffle 158 divides the opening 162 into the first cooling chamber 210 and the second cooling chamber 220, and the first cooling chamber 210 and the second cooling chamber 220 are respectively located on both sides of the vertical baffle 158.

In some embodiments, the first cooling chamber 210 and the second cooling chamber 220 respectively include skived fins, for example, the first skived fins 172 and the second skived fins 174 are respectively located in the first cooling chamber 210 and the second cooling chamber 220, and are isolated with each other with the vertical baffle 158.

In some embodiments, a liquid entrance hole 153, a liquid exit hole 157, a liquid entrance hole 155 and a liquid exit hole 159 are formed in the partition plate 150. The liquid entrance hole 153 and the liquid exit hole 157 are formed corresponding to the first cooling chamber 210, the liquid entrance hole 155 and the liquid exit hole 159 are formed corresponding to the second cooling chamber 220. The first pump 142 is located above the liquid exit hole 157, and the second pump 144 is located above the liquid exit hole 159. In some embodiments, the first pump 142 and the second pump 144 are centrifugal pumps, but the present invention is not limited thereto.

In some embodiments, a plurality of guiding blades 154 and a plurality of guiding blades 156 are respectively formed under the liquid entrance hole 153 and the liquid entrance hole 155 to guide the flow direction of the cooling liquid. In addition, the guiding blades 154 and/or the guiding blades 156 are formed an included angle 201 with the vertical baffle 158 to guide the cooling liquid toward the vertical baffle 158, i.e. toward the center of the heat dissipation plate 170, to effectively reduce the temperature of the heat source.

In some embodiments, the included angle 201 is approximately from 30 degrees to 60 degrees.

In some embodiments, the closer the distance between the vertical baffle 158 and the guiding blades 154 and/or the guiding blades 156, the greater the interval between two adjacent guiding blades, and the farther away from the vertical baffle 158, the smaller the interval between two adjacent guiding blades. For example, the interval 202 is greater than the interval 203, the interval 203 is greater than the interval 204, and the interval 204 is greater than the interval 205. In addition, the closer the distance between the vertical baffle 158 and the guiding blades 154 and/or the guiding blades 156, the greater the length of the guiding blade, and the farther away from the vertical baffle 158, the smaller the length of the guiding blade. For example, the guiding blade length 206 is greater than the guiding blade length 207, but the present invention is not limited thereto.

Hence, the cooling liquid can enter into the liquid cooling head 100 through the first cooling liquid inlet 132, then pass through the partition plate 150 downwardly by way of the liquid entrance hole 153, and be guided to the first skived fins 172 in the first cooling chamber 210 by the guiding blades 154 to take out the heat of the first skived fins 172. Subsequently, the cooling liquid is sucked upwardly through the liquid exit hole 157 by the first pump 142 and then exhausted out of the liquid cooling head 100 by way of the first cooling liquid outlet 134.

Similarly, the cooling liquid can enter into the liquid cooling head 100 through the second cooling liquid inlet 136, then pass through the partition plate 150 downwardly by way of the liquid entrance hole 155, and be guided to the second skived fins 174 in the second cooling chamber 220 by the guiding blades 156 to take out the heat of the second skived fins 174. Subsequently, the cooling liquid is sucked upwardly through the liquid exit hole 159 by the second pump 144 and then exhausted out of the liquid cooling head 100 by way of the second cooling liquid outlet 138.

Subsequently, referring to FIG. 3, the liquid cooling device 300 includes a foregoing liquid cooling head 100 and a first cooling tower 310. The first cooling tower 310 includes a first liquid entrance opening 312 and a first liquid exit opening 314, the first liquid entrance opening 312 is connected to the second cooling liquid outlet 138 of the second cooling chamber 220, the first liquid exit opening 314 is connected to the first cooling liquid inlet 132 of the first cooling chamber 210 so as to allow the cooling liquid entering into the first cooling tower 310 from the second cooling chamber 220 to dissipate the heat and then returning back to the first cooling chamber 210. In some embodiments, at another side of the liquid cooling head 100, a return pipe 320 is connected between the first cooling liquid outlet 134 and the second cooling liquid inlet 136 to allow the cooling liquid returning back to the liquid cooling head 100, but the present invention is not limited thereto. An internal return pipe can be connected between the first cooling liquid outlet 134 and the second cooling liquid inlet 136 to allow the cooling liquid flowing in the liquid cooling head 100, without departing from the spirit and scope of the present invention.

Referring to FIG. 4, the liquid cooling device 400 includes the foregoing liquid cooling device 300 and a second cooling tower 410. The second cooling tower 410 includes a second liquid entrance opening 412 and a second exit opening 414, the second liquid entrance opening 412 is connected to the first cooling liquid outlet 134 of the first cooling chamber 210, the second exit opening 414 is connected to the second cooling liquid inlet 136 of the second cooling chamber 220 to allow the cooling liquid entering into the second cooling tower 410 from the first cooling chamber 210 to dissipate the heat and then returning back to the second cooling chamber 220, but the present invention is not limited thereto.

In some embodiments, the liquid cooling device 400 includes a fan 330 disposed between the first cooling tower 310 and the second cooling tower 410, or one side of the first cooling tower 310 and/or the second cooling tower 410. In some embodiments, the fan 330 is an axial flow fan, for example, an 80 inches axial flow fan, but the present invention is not limited thereto.

In some embodiments, the first cooling tower 310 includes a lower water tank 316, an upper water tank 319, a plurality of flat liquid pipes 318 and a plurality of heat dissipation fins 317. The flat liquid pipes 318 are connected between the lower water tank 316 and the upper water tank 319 to fluid-connect the lower water tank 316 and the upper water tank 319, and the heat dissipation fins 317 surround the flat liquid pipes 318, and are located between the lower water tank 316 and the upper water tank 319. The second cooling tower 410 includes a lower water tank 416, an upper water tank 419, a plurality of flat liquid pipes 418 and a plurality of heat dissipation fins 417. The flat liquid pipes 418 are connected between the lower water tank 416 and the upper water tank 419 to fluid-connect the lower water tank 416 and the upper water tank 419, and the heat dissipation fins 417 surround the flat liquid pipes 418 and are located between the lower water tank 416 and the upper water tank 419.

In some embodiments, the first cooling tower 310 and the second cooling tower 410 of the liquid cooling device 400 respectively include an upper water tank cover and a lower water tank cover. The following description will take the first cooling tower 310 as an example, and the second cooling tower 410 will not be described in detail.

Simultaneously refer to FIGS. 3, 5A and 5B, the first cooling tower 310 of the liquid cooling device 300 includes an upper water tank cover 341 and a lower water tank cover 351. The upper water tank cover 341 is disposed between the upper water tank 319 and the heat dissipation fins 317, and the lower water tank cover 351 is disposed between the lower water tank 316 and the heat dissipation fins 317. The upper water tank cover 341 includes a plurality of elastic clamping devices 342, e.g. elastic claws, and the upper water tank 319 includes a fixing flange 349, the elastic clamping devices 342 are bent and pressed on the fixing flange 349 of the upper water tank 319 to allow the upper water tank 319 able to be clamped on and stably fixed on the upper water tank cover 341 and the heat dissipation fins 317 to fluid-connect to the flat liquid pipes 318. In addition, the lower water tank cover 351 includes a plurality of elastic clamping device 352, e.g. elastic claws, and the lower water tank cover 351 includes a fixing flange 359, the elastic clamping devices 352 are bent and pressed on the fixing flange 359 of the lower water tank 316 to allow the lower water tank 316 able to be clamped under and stably fixed under the lower water tank cover 351 and the heat dissipation fins 317 to fluid-connect to the flat liquid pipes 318.

In some embodiments, the first cooling tower 310 and the second cooling tower 410 have the same size and shared components to be symmetrically connected to two sides of the liquid cooling head 100.

Accordingly, the liquid cooling head and the liquid cooling device with the same can utilize a single cooling tower or a plurality of cooling towers to dissipate heat according to actual needs, and adjust the required heat dissipation efficiency and performance according to heat quantity generated by the heat source, and the components of the liquid cooling head and/or the liquid cooling device are symmetrical and shared so as to further reduce production costs and improve product quality thereof. The arrangement of the upper water tank and the lower water tank can increase the storage capacity of the cooling liquid as required, and effectively improve the heat dissipation efficiency and heat dissipation performance.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A liquid cooling head, comprising:
a bottom plate having an opening;
a heat dissipation plate fixed to the bottom plate;
a partition plate fixed on the bottom plate to divide the opening into a plurality of cooling chambers;
an upper cover plate fixed on the bottom plate; and
a plurality of guiding blades formed under the partition plate to guide a cooling liquid;
wherein each of the cooling chambers is respectively equipped with a cooling liquid inlet formed in the upper cover plate, a cooling liquid outlet formed in the upper cover plate, a pump arranged between the partition plate and the upper cover plate, and an electric control device rotating a corresponding pump to force the cooling liquid to flow through a corresponding chamber of the cooling chambers to cool at least one heat source below the heat dissipation plate;
wherein the partition plate comprises a horizontal baffle and a vertical baffle, the vertical baffle is connected to the horizontal baffle, and the vertical baffle divides the opening into the cooling chambers respectively located on both sides of the vertical baffle, an included angle is formed between the guiding blades and the vertical baffle to guide the cooling liquid flowing toward the vertical baffle, and an interval between two adjacent guiding blades close to the vertical baffle is gradually larger than an interval between two adjacent guiding blades far away from the vertical baffle.

2. The liquid cooling head of claim 1, further comprising an outer cover plate sealed on the upper cover plate.

3. The liquid cooling head of claim 1, wherein the corresponding cooling chamber of the cooling chambers comprises a liquid entrance hole and a liquid exit hole on the partition plate, and the corresponding pump is located above the liquid exit hole of the corresponding cooling chamber of the cooling chambers.

4. The liquid cooling head of claim 1, wherein the guiding blades are formed under a liquid entrance hole of the corresponding cooling chamber of the cooling chambers to guide the cooling liquid.

5. The liquid cooling head of claim 1, wherein the included angle is about 30 degrees to 60 degrees.

6. The liquid cooling head of claim 1, wherein a guiding blade length of a guiding blade close to the vertical baffle is gradually larger than a guiding blade length of a guiding blade far away from the vertical baffle.

7. The liquid cooling head of claim 1, wherein each of the cooling chambers comprises skived fins therein.

8. A liquid cooling device, comprising:
a liquid cooling head, wherein the liquid cooling head comprises:
a bottom plate having an opening;
a heat dissipation plate fixed to the bottom plate;
a partition plate fixed on the bottom plate to divide the opening into a plurality of cooling chambers;
an upper cover plate fixed on the bottom plate; and
a plurality of guiding blades formed under the partition plate to guide a cooling liquid;
wherein each of the cooling chambers is respectively equipped with a cooling liquid inlet formed in the upper cover plate, a cooling liquid outlet formed in the upper cover plate, a pump arranged between the partition plate and the upper cover plate, and an electric control device rotating a corresponding pump to force the cooling liquid to flow through a corresponding chamber of the cooling chambers to cool at least one heat source below the heat dissipation plate;
wherein the partition plate comprises a horizontal baffle and a vertical baffle, the vertical baffle is connected to the horizontal baffle, and the vertical baffle divides the opening into the cooling chambers respectively located on both sides of the vertical baffle, an included angle is formed between the guiding blades and the vertical baffle to guide the cooling liquid flowing toward the vertical baffle, and an interval between two adjacent guiding blades close to the vertical baffle is gradually larger than an interval between two adjacent guiding blades far away from the vertical baffle;
wherein the cooling chambers comprises a first cooling chamber and a second cooling chamber; and a first cooling tower, wherein the first cooling tower comprises a first liquid entrance opening and a first liquid exit opening, wherein the first liquid entrance opening is connected to the cooling liquid outlet of the second cooling chamber, and the first liquid exit opening is connected to the cooling liquid inlet of the first cooling chamber to allow the cooling liquid from the second cooling chamber entering into the first cooling tower to dissipate heat and then entering into the first cooling chamber.

9. The liquid cooling device of claim 8, further comprising:

a second cooling tower, wherein the second cooling tower comprises a second liquid entrance opening and a second exit opening, the second liquid entrance opening is connected to the cooling liquid outlet of the first cooling chamber, the second exit opening is connected to the cooling liquid inlet of the second cooling chamber to allow the cooling liquid from the first cooling chamber entering into the second cooling tower to dissipate heat and then entering into the second cooling chamber.

10. The liquid cooling device of claim 9, further comprising:

a fan disposed between the first cooling tower and the second cooling tower.

11. The liquid cooling device of claim 10, wherein the first cooling tower and the second cooling tower respectively comprise:

a lower water tank;

an upper water tank;

a plurality of flat liquid pipes connected between the lower water tank and the upper water tank;

a plurality of heat dissipation fins, surrounding the flat liquid pipes, located between the lower water tank and the upper water tank;

an upper water tank cover located between the upper water tank and the heat dissipation fins; and a lower water tank cover located between the lower water tank and the heat dissipation fins, wherein the upper water tank cover and the lower water tank cover respectively comprise a plurality of elastic clamping devices, the upper water tank and the lower water tank respectively comprise a fixing flange, and the elastic clamping devices are respectively bent and pressed on a corresponding fixing flange.

12. The liquid cooling device of claim 10, wherein the first cooling tower and the second cooling tower have a same size and symmetrically located on two sides of the liquid cooling head.

13. The liquid cooling device of claim 8, further comprising:

a return pipe connected between the cooling liquid outlet of the first cooling chamber and the cooling liquid inlet of the second cooling chamber.

\* \* \* \* \*